US007394105B2

(12) United States Patent
Goto

(10) Patent No.: US 7,394,105 B2
(45) Date of Patent: Jul. 1, 2008

(54) ACTIVE MATRIX DISPLAY AND METHOD OF MANUFACTURING THE SAME

(75) Inventor: Yasumasa Goto, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 390 days.

(21) Appl. No.: 10/995,181

(22) Filed: Nov. 24, 2004

(65) Prior Publication Data

US 2005/0116906 A1 Jun. 2, 2005

(30) Foreign Application Priority Data

Nov. 28, 2003 (JP) ............................ 2003-400612

(51) Int. Cl.
*H01L 29/18* (2006.01)
*H01L 33/00* (2006.01)

(52) U.S. Cl. .............................. 257/88; 257/59; 257/72

(58) Field of Classification Search .................. 257/88, 257/59, 72; 313/500

See application file for complete search history.

(56) References Cited

U.S. PATENT DOCUMENTS 5,977,563 A * 11/1999 Kubo et al. .................. 257/72
6,072,517 A * 6/2000 Fork et al. .................. 347/237
6,359,606 B1 * 3/2002 Yudasaka ...................... 345/87
2001/0043168 A1 * 11/2001 Koyama et al. ............... 345/52
2002/0063515 A1 * 5/2002 Goto .......................... 313/500
2004/0121523 A1 * 6/2004 Nakanishi .................. 438/128

FOREIGN PATENT DOCUMENTS

| | | | |
|---|---|---|---|
| JP | 05-134629 | * | 5/1993 |
| JP | 11-109313 | | 4/1999 |
| JP | 11-344723 | | 12/1999 |
| KR | 2001-0021217 | | 3/2001 |

* cited by examiner

*Primary Examiner*—Jerome Jackson
*Assistant Examiner*—Anthony Ho
(74) *Attorney, Agent, or Firm*—Oblon, Spivak, McClelland, Maier & Neustadt, P.C.

(57) ABSTRACT

There is provided an active matrix display including pixels arrayed in a matrix form and each including a display element and a thin film transistor. In each of columns which the pixels form, the pixels are divided into a first pixel group in which the thin film transistors are arranged along a first straight line parallel with the column, and a second pixel group in which the thin film transistors are arranged along a second straight line parallel with the column and spaced apart from the first straight line.

7 Claims, 7 Drawing Sheets

ACTIVE MATRIX DISPLAY AND METHOD OF MANUFACTURING THE SAME

CROSS-REFERENCE TO RELATED APPLICATIONS

This application is based upon and claims the benefit of priority from prior Japanese Patent Application No. 2003-400612, filed Nov. 28, 2003, the entire contents of which are incorporated herein by reference.

BACKGROUND OF THE INVENTION

1. Field of the Invention

The present invention relates to an active matrix display and a manufacturing method thereof.

2. Description of the Related Art

Displays such as light-emitting diode displays and liquid crystal displays have advantageous characteristics such as decreased thickness. For this reason, these displays have been used for office equipment, computers, and the like. Recently, organic EL (Electro-Luminescent) displays have been developed, which are superior to liquid crystal displays in the following points.

1) An organic EL display is bright and self-emissive, and hence can realize a bright and clear display, a wide viewing angle, and reductions in power consumption, weight and thickness owing to a backlight-less structure.

2) An organic EL display is driven by a DC constant voltage, and hence is robust against noise.

3) The response speed of an organic EL display is on the order of μsec, whereas the response speed of a liquid crystal display is on the order of msec. Therefore, smooth moving-image display can be realized.

4) In an organic EL display, display elements can be formed by using only solid-state elements. This makes it possible to extend the operating temperature range.

Of the above displays, an active matrix display using polysilicon thin film transistors for the respective pixels, in particular, can realize excellent display characteristics.

In such an active matrix display, however, display irregularity tends to be visually recognized due to variations in the characteristics of the polysilicon thin film transistors among the respective pixels. This phenomenon is especially noticeable when display elements change their optical characteristics in accordance with the magnitude of a current flowing therethrough, like organic EL elements, and the above polysilicon thin film transistor is a drive transistor which is connected in series with the display element.

Note that Jpn. Pat. Appln. KOKAI Publication No. 11-344723 discloses a technique associated with the present invention. According to this reference, a drive circuit to be placed around a display area is composed of a normal circuit and redundant circuit, and different laser shots are used to perform laser annealing for the formation of a polysilicon thin film transistor contained in a given normal circuit and laser annealing for the formation of a polysilicon thin film transistor contained in a redundant circuit paired with the given normal circuit. In addition, the reference describes a technique of scanning a linear beam on a pixel array in an oblique direction in a laser annealing process. The reference, however, does not describe that the relative positions of polysilicon thin film transistors with respect to pixels are made different among the pixels.

BRIEF SUMMARY OF THE INVENTION

It is an object of the present invention to provide an active matrix display whose display irregularity is hard to recognize and a method of manufacturing the same.

According to a first aspect of the present invention, there is provided an active matrix display comprising pixels arrayed in a matrix form and each including a display element and a thin film transistor which controls intensity of current flowing through the display element, wherein, in each of columns which the pixels form, the pixels are divided into a first pixel group in which the thin film transistors are arranged along a first straight line parallel with the column, and a second pixel group in which the thin film transistors are arranged along a second straight line parallel with the column and spaced apart from the first straight line.

According to a second aspect of the present invention, there is provided an active matrix display comprising pixels arrayed in a matrix form and each including a display element and a polysilicon thin film transistor, wherein, in each of columns which the pixels form, the pixels are divided into a first pixel group in which the polysilicon thin film transistors are arranged along a first straight line parallel with the column, and a second pixel group in which the polysilicon thin film transistors are arranged along a second straight line parallel with the column and spaced apart from the first straight line.

According to a third aspect of the present invention, there is provided a method of manufacturing an active matrix display comprising pixels arrayed in a matrix form and each including a display element and a thin film transistor which controls intensity of current flowing through the display element, wherein, in each of columns which the pixels form, the pixels are divided into a first pixel group in which the thin film transistors are arranged along a first straight line parallel with the column, and a second pixel group in which the thin film transistors are arranged along a second straight line parallel with the column and spaced apart from the first straight line, comprising forming semiconductor layers of the thin film transistors by irradiating an amorphous semiconductor layer with laser beam as linear beam while shifting a region of the amorphous semiconductor layer where the linear beam irradiates, wherein irradiating the amorphous semiconductor layer with laser beam is carried out such that longitudinal direction of the region is parallel with the column.

According to a fourth aspect of the present invention, there is provided a method of manufacturing an active matrix display comprising pixels arrayed in a matrix form and each including a display element and a polysilicon thin film transistor, wherein, in each of columns which the pixels form, the pixels are divided into a first pixel group in which the thin film transistors are arranged along a first straight line parallel with the column, and a second pixel group in which the thin film transistors are arranged along a second straight line parallel with the column and spaced apart from the first straight line, comprising forming polysilicon layers of the polysilicon thin film transistors by irradiating an amorphous silicon layer with laser beam as linear beam while shifting a region of the amorphous silicon layer where the linear beam irradiates, wherein irradiating the amorphous silicon layer with laser beam is carried out such that longitudinal direction of the region is parallel with the column.

According to a fifth aspect of the present invention, there is provided a method of manufacturing an active matrix display comprising pixels arrayed in a matrix form and each including a display element and a polysilicon thin film transistor, wherein, in each row which the pixels form, the pixels are divided into a first pixel group in which the thin film transistors are arranged along a first straight line parallel with the row, and a second pixel group in which the thin film transistors are arranged along a second straight line parallel with the row and spaced apart from the first straight line, comprising forming polysilicon layers of the polysilicon thin film transistors by irradiating an amorphous silicon layer with laser beam as linear beam while shifting a region of the amorphous silicon layer where the linear beam irradiates, wherein irradiating the amorphous silicon layer with laser beam is carried out such that longitudinal direction of the region is parallel with the row.

The term "linear beam" means a light beam which can simultaneously irradiate a linear or band-shaped region within a plane when emitting the light beam from the direction perpendicular to the plane.

DETAILED DESCRIPTION OF THE INVENTION

Figure 1:
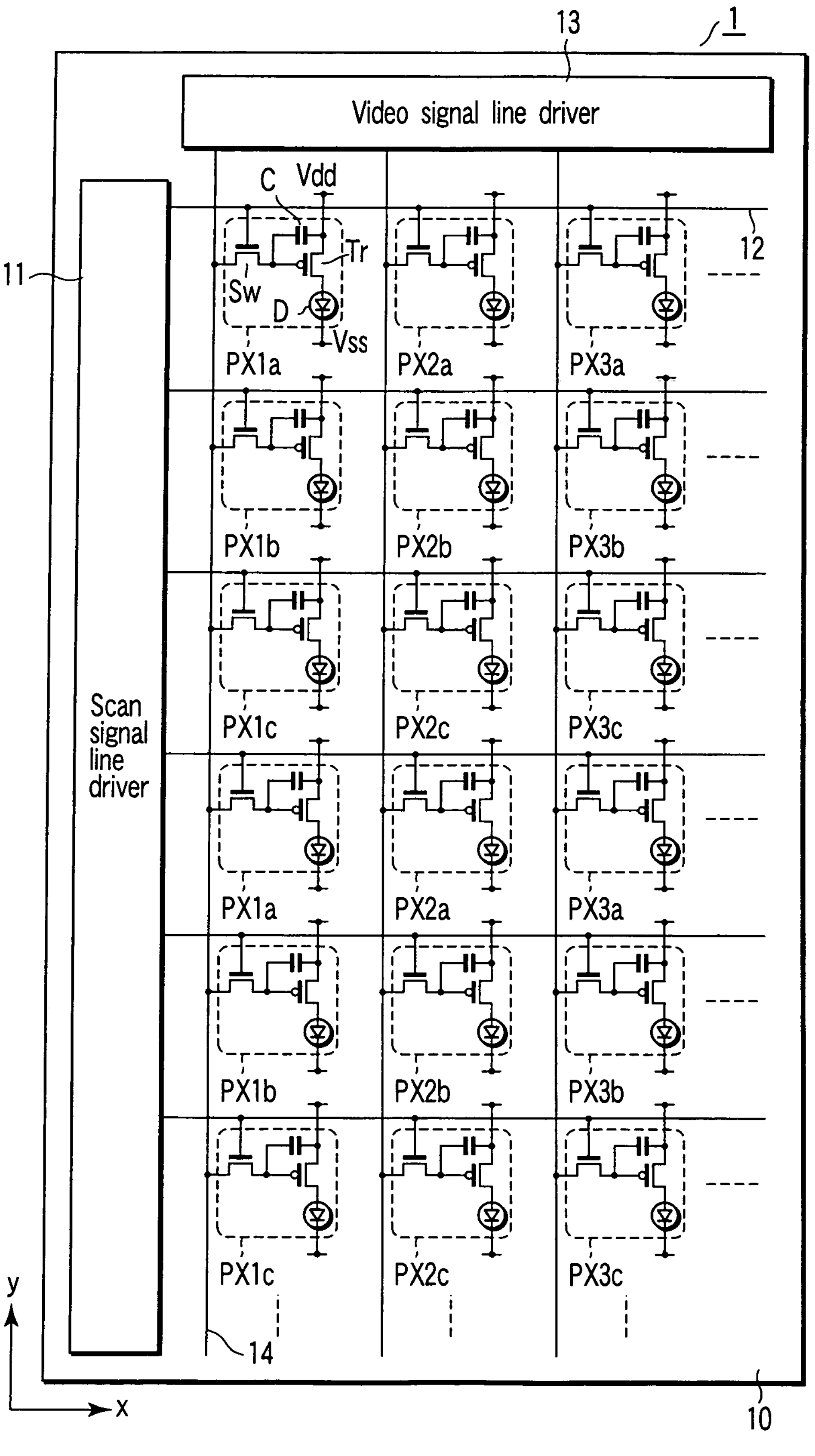
FIG. 1 is a plan view schematically showing an active matrix display according to an embodiment of the present invention.

An embodiment of the present invention will be described in detail below with reference to the views of the accompanying drawing. Note that throughout the drawing, the same reference numerals denote constituent elements having same or similar functions, and a repetitive description thereof will be avoided.

FIG. 1 is a plan view schematically showing an active matrix display according to an embodiment of the present invention. FIG. 1 shows an organic EL display 1 as an example of the active matrix display according to this embodiment.

The organic EL display 1 includes an insulating substrate 10 such as a glass substrate. Pixels PX are arranged in a matrix form on one major surface of the substrate 10. On the substrate 10, scan signal lines 12 connected to a scan signal line driver 11 and video signal lines 14 connected to a video signal line driver 13 are so arranged as to intersect each other.

Each pixel PX includes a drive transistor Tr as a drive control element, a capacitor C, a pixel switch Sw, and an organic EL element D which is a display element. Of these components, the drive transistor Tr, capacitor C, and pixel switch Sw constitute a drive circuit. In this case, for example, the drive transistor Tr is a p-channel polysilicon thin film transistor (poly-Si TFT), and the pixel switch Sw is an n-channel poly-Si TFT. In addition, assume that pixel PX(3×M−2)a, PX(3×M−2)b, and PX(3×M−2)c emit red light, pixels PX(3×M−1)a, PX(3×M−1)b, and PX(3×M−1)c emit blue light, and pixels PX(3×M)a, PX(3×M)b, and PX(3×M)c emit green light.

The drive transistor Tr and organic EL element D are connected in series between a first power supply terminal Vdd set at a higher potential and a second power supply terminal Vss set at a lower potential. The pixel switch Sw is connected between the video signal line 14 and the gate of the drive transistor Tr. The gate of the pixel switch Sw, which serves as a control terminal, is connected to the scan signal line 12. The capacitor C is connected between the first power supply terminal Vdd and the gate of the drive transistor Tr.

In this embodiment, in each column of the pixels PX, a pixel group of pixels PXNa, a pixel group of pixels PXNb, and a pixel group of pixels PXNc are different from one another in the relative position of the drive transistor Tr with respect to the column in the x direction. Note that the x direction is the direction crossing each column of the pixels PX, and coincides with a scan direction (to be described later). The y direction is the direction parallel to each column of the pixels PX, and coincides with the longitudinal direction of a region irradiated with a linear beam (to be described later).

A method of manufacturing the organic EL display 1 will be described next.

Figure 2:
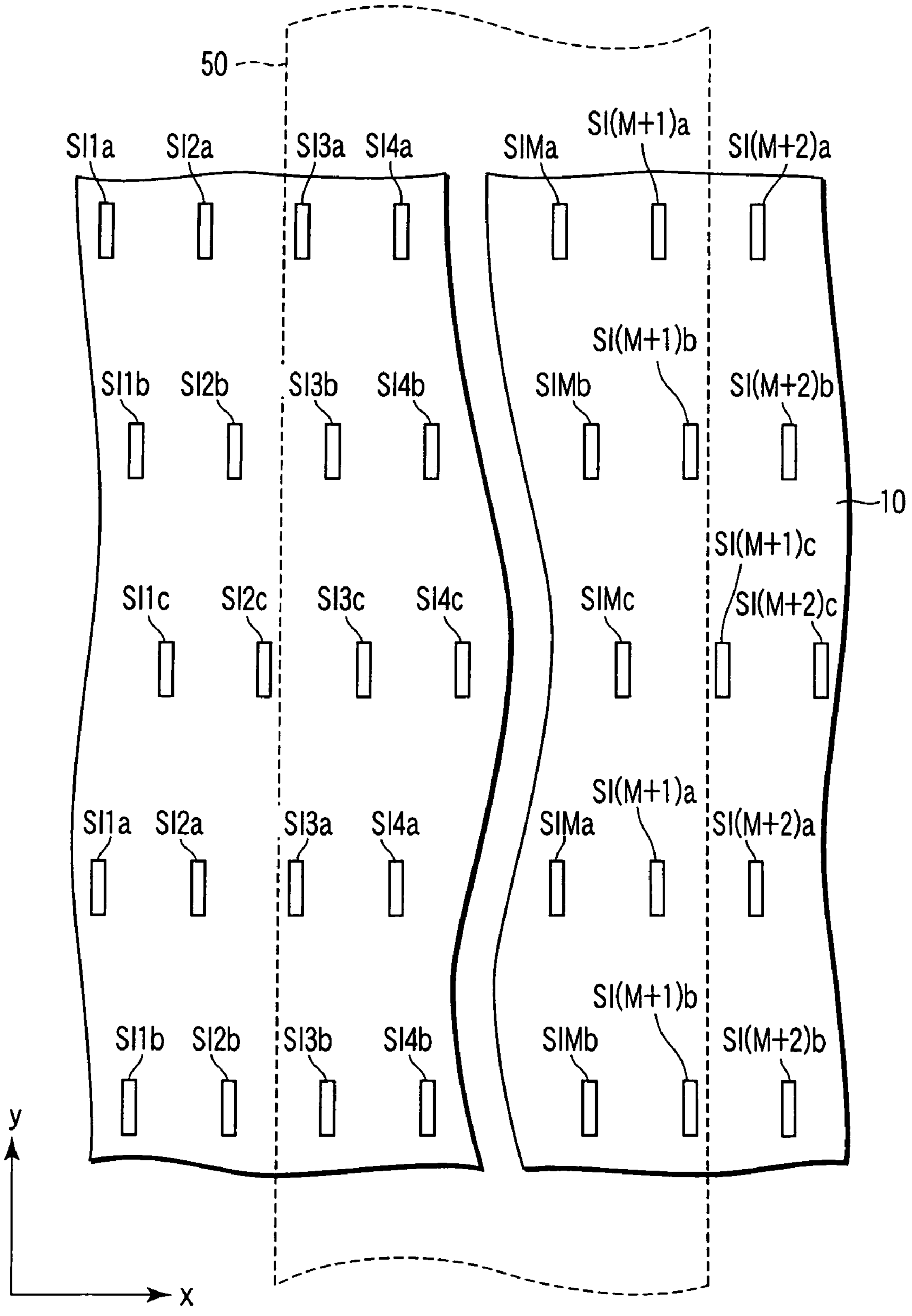
FIG. 2 is a plan view showing an example of a method which can be used for the manufacture of the display shown in FIG. 1.

FIG. 2 is a plan view showing an example of a method which can be used for the manufacture of the display shown in FIG. 1. Referring to FIG. 2, reference symbol SI denotes a portion (to be referred to as a transistor formation portion hereinafter) of the silicon layer formed on the substrate 10 which is to be used as a semiconductor layer in which the channel, source and drain regions of the drive transistor Tr are formed. Reference numeral 50 denotes a linear beam which is a laser beam to be applied to the silicon layer in a laser annealing process.

Note that the suffix attached to each transistor formation portion SI corresponds to the suffix attached to each pixel PX in FIG. 1. Referring to FIG. 2, the silicon layer located on the right side of the linear beam 50 is an amorphous silicon layer, and the silicon layer located on the left side of the linear beam 50 is a crystalline silicon layer.

In this embodiment, when laser annealing is to be performed, the longitudinal direction of the linear beam 50 is made parallel with the y direction, and the linear beam 50 is scanned on the substrate 10 in the x direction at a predetermined pitch P. That is, the linear beam 50 is moved relative to the substrate 10 in the x direction at the pitch P. Typically, the position of the linear beam 50 is fixed inside an annealing apparatus, the substrate 10 on the stage is continuously moved with respect to the linear beam 50, and the linear beam 50 is emitted in the form of pulses at a predetermined timing.

The pitch P at which the linear beam 50 is scanned is set to be smaller than the length of the pixel PX in the x direction, i.e., the pixel pitch. For example, the pitch P is set to about ⅓ the pixel pitch. In addition, the length of the linear beam 50 in the x direction is set to be larger than the pitch P at which the linear beam 50 is scanned.

When laser annealing is performed by this method, display irregularity becomes hard to be recognized. This will be described in comparison with the structure shown in FIG. 3.

Figure 3:
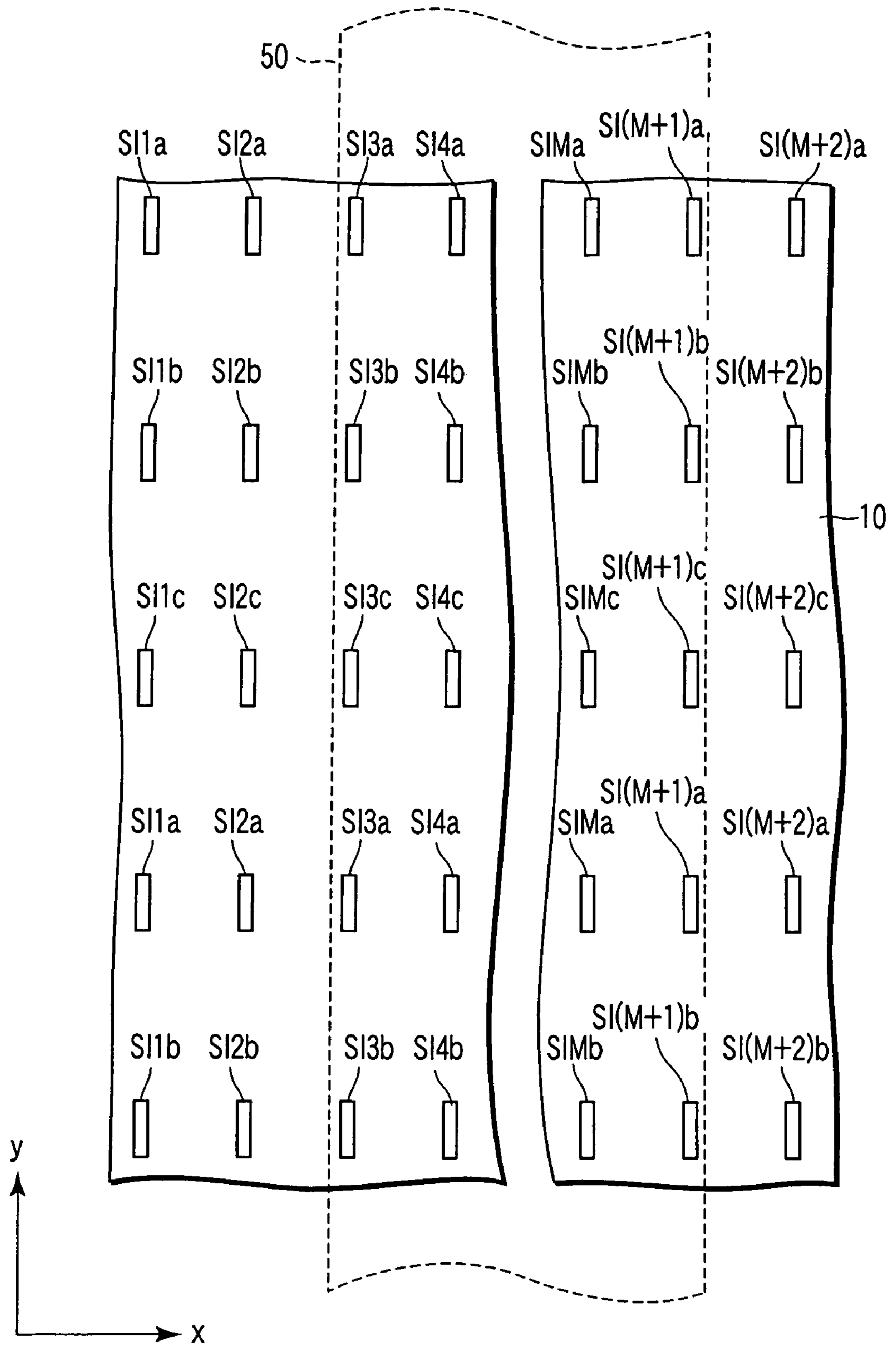
FIG. 3 is a plan view showing a laser annealing method according to a comparative example.

FIG. 3 is a plan view showing a laser annealing method according to a comparative example.

In the structure shown in FIG. 3, transistor formation portions SINa, SINb, and SINc are arranged in a line in the y direction. According to the method shown in FIG. 3, all the transistor formation portions SINa, SINb, and SINc arranged in the y direction are simultaneously irradiated with the linear beam 50 by one laser shot.

It has been found from the studies conducted by the present inventor that variation in mobility among transistors whose silicon layers have been subjected to the same laser shot during a laser annealing process is much smaller than that among transistors whose silicon layers have been subjected to different laser shots during a laser annealing process. For this reason, in the organic EL display 1 manufactured by the method shown in FIG. 3, variation in mobility of transistor among the pixels PX arranged in the y direction is smaller than that among the pixels PX arranged in the x direction.

If the mobility of the drive transistor Tr is smaller than a design value, the luminance of the organic EL element D becomes lower than the value expected from the magnitude of a video signal supplied to the pixel PX. In contrast, if the mobility of the drive transistor Tr is larger than the design value, the luminance of the organic EL element D becomes higher than the value expected from the magnitude of a video signal supplied to the pixel PX.

According to the method shown in FIG. 3, therefore, luminance varies among the pixels PX arranged in the x direction, whereas luminance hardly varies among the pixels PX arranged in the y direction. In the organic EL display 1 manufactured by the method shown in FIG. 3, therefore, uniformity in luminance of the pixels arranged in the y direction makes irregularity in luminance of the pixels arranged in the x direction stand out, and hence display irregularity in the form of stripes extending in the y direction, and more specifically, luminance irregularity, tend to be visually recognized.

In contrast to this, according to the method shown in FIG. 2, of the pixels PX arranged in the y direction, variations in luminance occur among the pixel group including the pixels PXNa, the pixel group including the pixels PXNb, and the pixel group including the pixels PXNc, in addition to variations in luminance among the pixels PX arranged in the x direction. Such variations occur randomly. Therefore, variations in luminance among the respective pixels PX are compensated for by the pixels PX adjacent to them in the x and y directions. According to this embodiment, therefore, display irregularity becomes hard to be recognized.

When the method shown in FIG. 2 is used, the obtained organic EL display 1 has a characteristic that each of the pixel group including pixels PXNa, the pixel group including pixels PXNb, and the pixel group including pixels PXNc is smaller in mobility variation of the drive transistors Tr than the column including pixels PXNa to PXNc.

In this embodiment, the organic EL elements D can be variously arranged. This will be described with reference to FIGS. 4 and 5.

Figure 4:
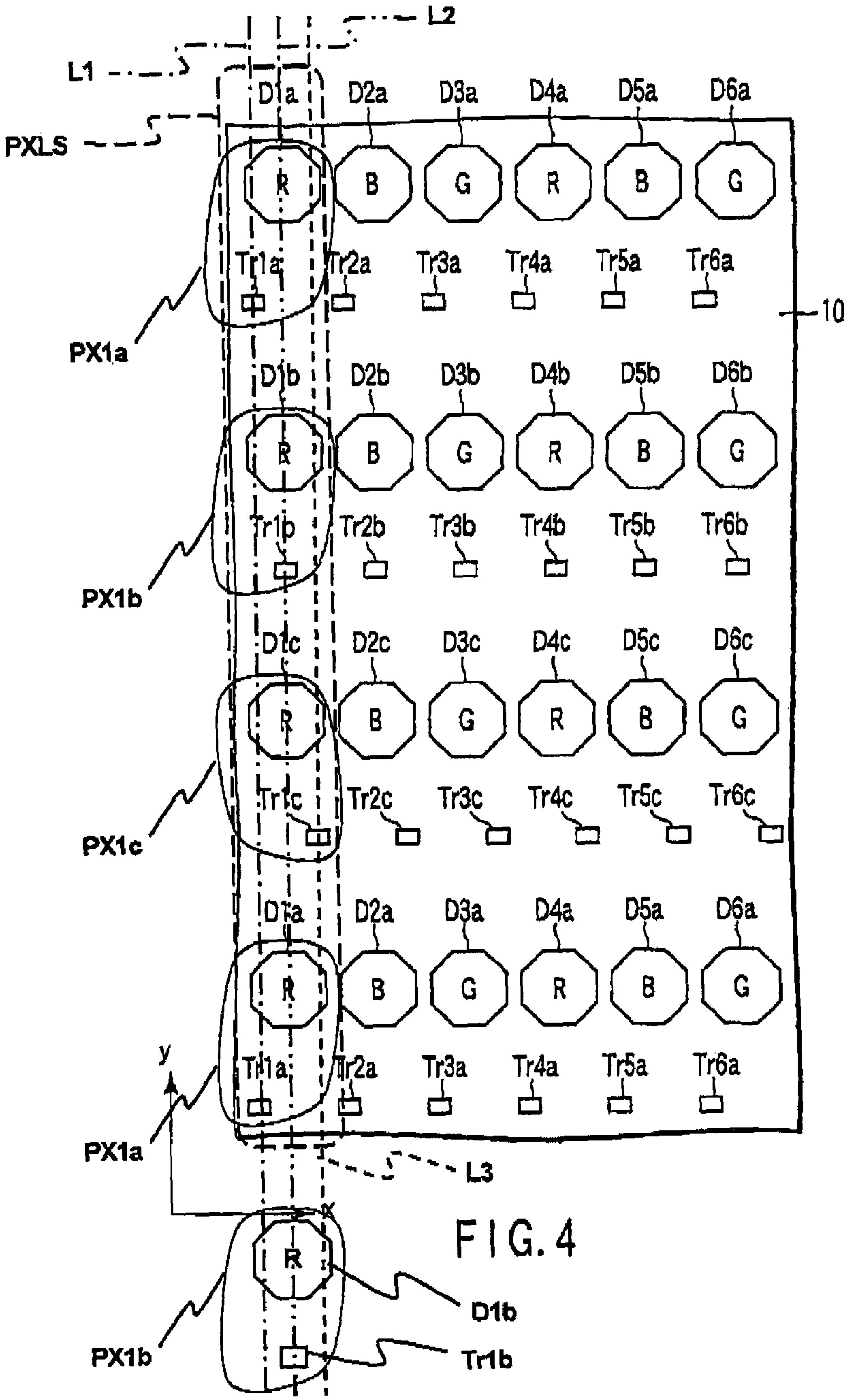
FIG. 4 is a plan view schematically showing an example of the arrangement of display elements which can be adopted for the display in FIG. 1.

FIG. 4 is a plan view schematically showing an example of the arrangement of organic EL elements which can be used for the organic EL display shown in FIG. 1.

Figure 5:
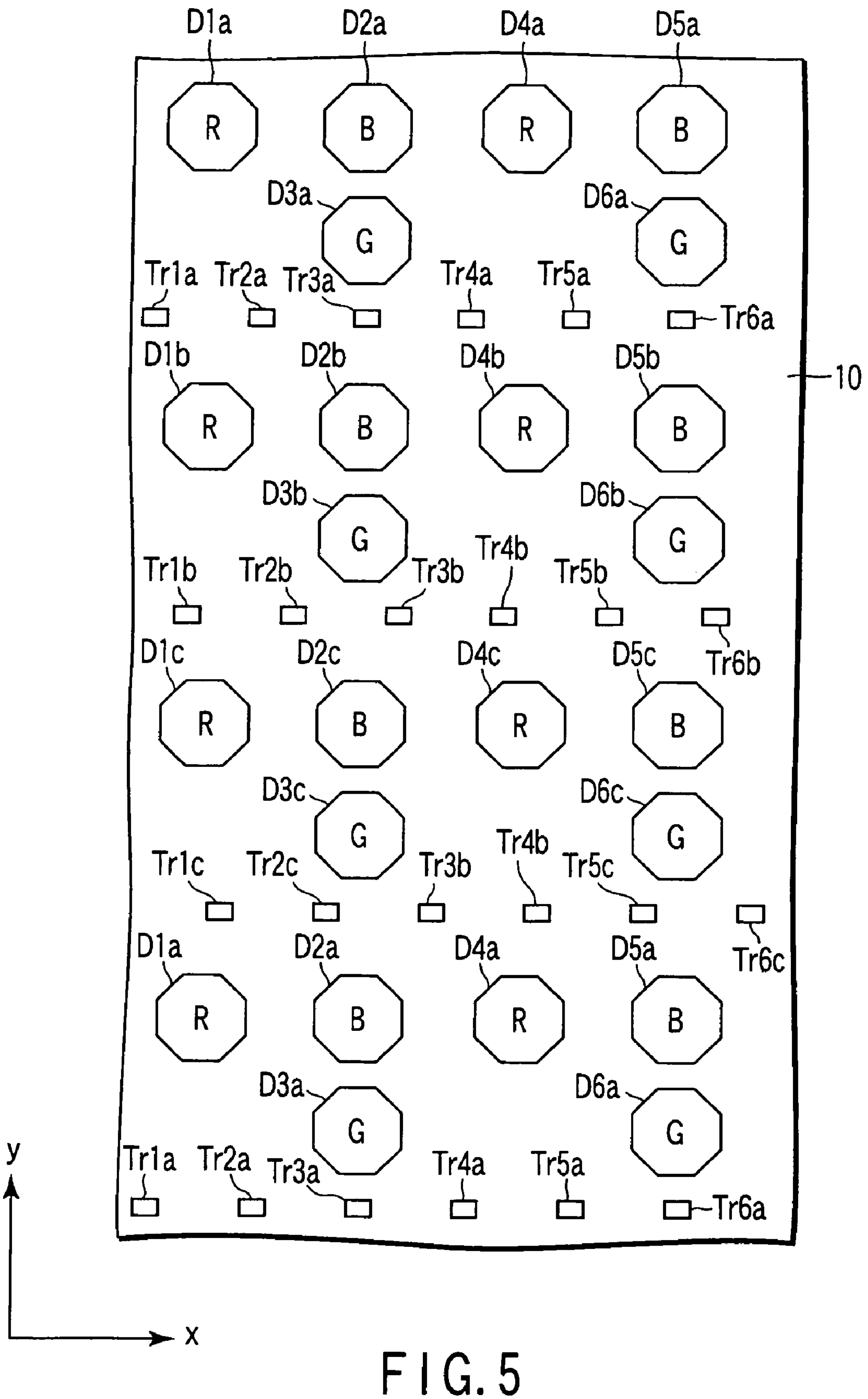
FIG. 5 is a plan view schematically showing another example of the arrangement of display elements which can be adopted for the display in FIG. 1.
Figure 6:
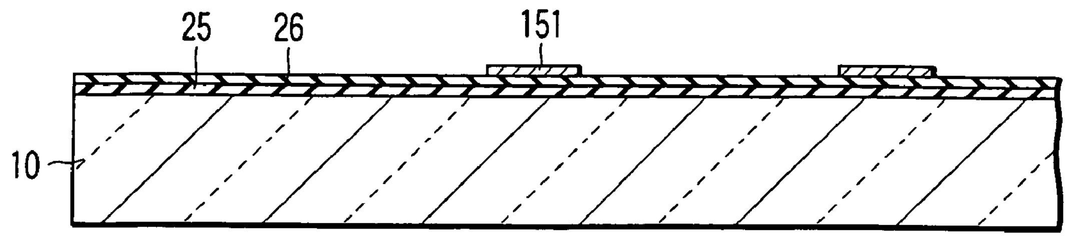
FIGS. 6 to 11 are sectional views showing an example of a method which can be used for the manufacture of the display shown in FIG. 1.

FIG. 5 is a plan view schematically showing another example of the arrangement of organic EL elements which can be used for the organic EL display shown in FIG. 1. Referring to FIGS. 4 and 5, the suffixes attached to the organic EL elements D and drive transistors Tr correspond to the suffices attached to the pixels PX shown in FIG. 1.

In the structures shown in FIGS. 4 and 5, for example, organic EL elements D(3×m−2)a, D(3×m−2)b, and D(3×m−2)c emit red light, organic EL elements D(3×m−1)a, D(3×m−1)b, and D(3×m−1)c emit blue light, and organic EL elements D(3×m)a, D(3×m)b, and D(3×m)c emit green light.

In the structure shown in FIG. 4, the organic EL elements D which respectively emit red light, blue light, and green light are repeatedly arranged in this order in the x direction. That is, the organic EL elements D are arranged in the form of stripes. In contrast, in the structure shown in FIG. 5, the organic EL elements D which respectively emit red light, blue light, and green light are arranged in an L shape. In this manner, the organic EL elements D can be arranged in various forms.

In this embodiment, as described above, each column formed by the pixels PX arranged in the y direction are composed of the three pixel groups, i.e., the pixel group including the pixels PXNa, the pixel group including the pixels PXNb, and the pixel group including the pixels PXNc. However, the number of pixel groups constituting each column is not specifically limited as long as it is two or more.

In this embodiment, the positions of the drive transistors Tr in the x direction are made different among the respective pixel groups. However, the positions of other transistors included in the pixels PX in the x direction may be made different. For example, the positions of transistors used as the pixel switches Sw in the x direction may be made different among the pixel groups. Alternatively, when another circuit arrangement is used for each pixel PX, the positions of other transistors included in the pixels PX in the x direction may made different among the pixel groups. The above effect is, however, most prominent when positions of transistors, each of which is connected in series with the organic EL element D between the first power supply terminal Vdd and the second power. supply terminal Vss, are made different among the above pixel groups.

This embodiment has exemplified the organic EL display 1 as an active matrix display. However, the above effects can be obtained even if the present invention is applied to another active matrix display. The above technique is very effective for an active matrix display using, as a display element, an element whose optical characteristics change in accordance with the magnitude of a current flowing therethrough, in particular.

An example of the present invention will be described below.

EXAMPLE

FIGS. 6 to 11 are sectional views showing a n example of a method which can be used for the manufacture of the display shown in FIG. 1.

In this case, an organic EL display 1 shown in FIG. 1 was manufactured by the method to be described below with reference to FIGS. 6 to 11. Note that in the organic EL display 1, the arrangement shown in FIG. 2 is adopted for transistor formation portions SI and the arrangement shown in FIG. 4 is adopted for organic EL elements D and drive transistors Tr.

After, for example, an SiNx layer 25 and $SiO_2$ layer 26 were formed as undercoat layers on a glass substrate 10, an amorphous silicon layer having a thickness of about 50 nm was formed on the resultant structure. The amorphous silicon layer was then formed into a polysilicon layer by performing laser annealing using, for example, an XeCl excimer laser. The polysilicon layer was patterned to leave a portion corresponding to the transistor formation portion SI shown in FIG. 2, thereby forming a polysilicon layer 151 in the shape shown in FIG. 6.

In this case, a triplet was composed of three pixels PX arranged in the x direction. The length of the triplet in the x direction was 198 μm. That is, the length of the pixel PX in the x direction was 66 μm. In performing laser annealing, the length of a region irradiated with a linear beam 50 by one laser shot in the scan direction (x direction) was set to 440 μm, and the linear beam 50. was scanned at a pitch of 22 μm. That is, the number of laser shots per portion was 20. In addition, a transistor formation portion SINb was shifted from a transistor formation portion SINa by 22 μm in the x direction, and a transistor formation portion SINc was shifted from the transistor formation portion SINa by 44 μm in the x direction.

Figure 7:
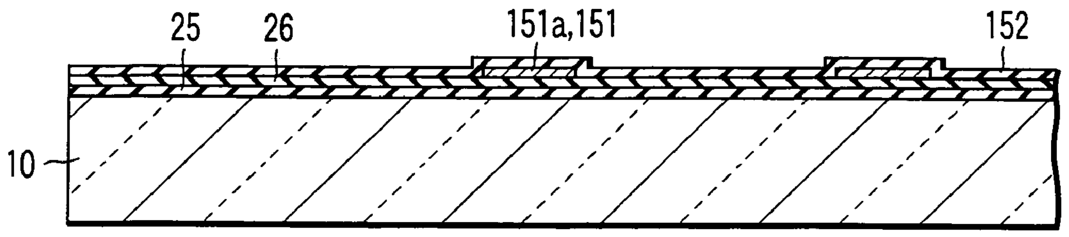

As shown in FIG. 7, a gate insulating film 152 was formed on the surface of the substrate 10 on which the polysilicon layer 151 was formed. An $n^+$ region 151*a* was formed in the polysilicon layer 151 by the ion doping method.

Figure 8:
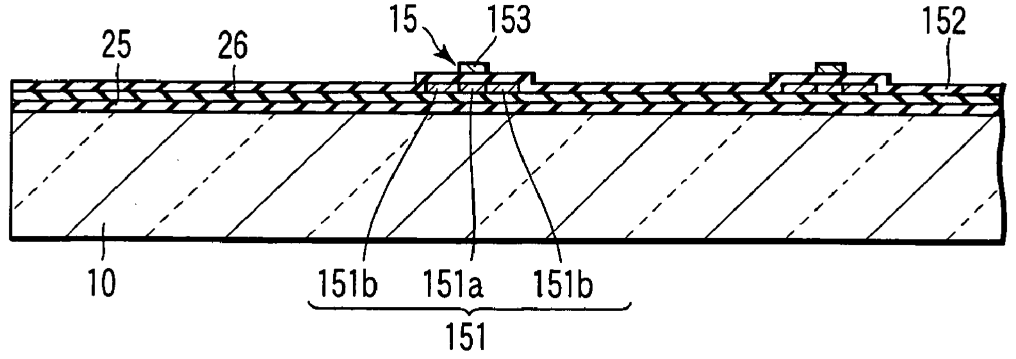

As shown in FIG. 8, a gate electrode 153 was formed on the gate insulating film 152. A $p^+$ region 151*b* was then formed in the polysilicon layer 151 by the ion doping method using the gate electrode 153 as a mask. In this manner, a p-channel poly-Si TFT 15 was manufactured as the drive transistor Tr. At the same time, a transistor used as the pixel switch Sw and transistors in a scan signal line driver 11 and video signal line driver 13 were manufactured. In addition, when the gate electrode 153 was formed, a video signal line 14 and the like were simultaneously formed.

Figure 9:
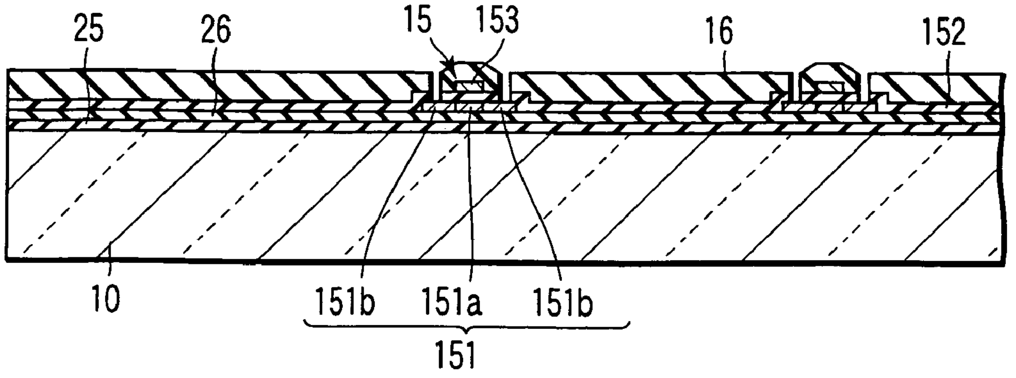

Subsequently, as shown in FIG. 9, a dielectric interlayer 16 having a thickness of 700 nm was formed on the surface of the substrate 10 on which the p-channel poly-Si TFT 15 was formed. A through hole was then formed in the dielectric interlayer 16 and gate insulating film 152.

Figure 10:
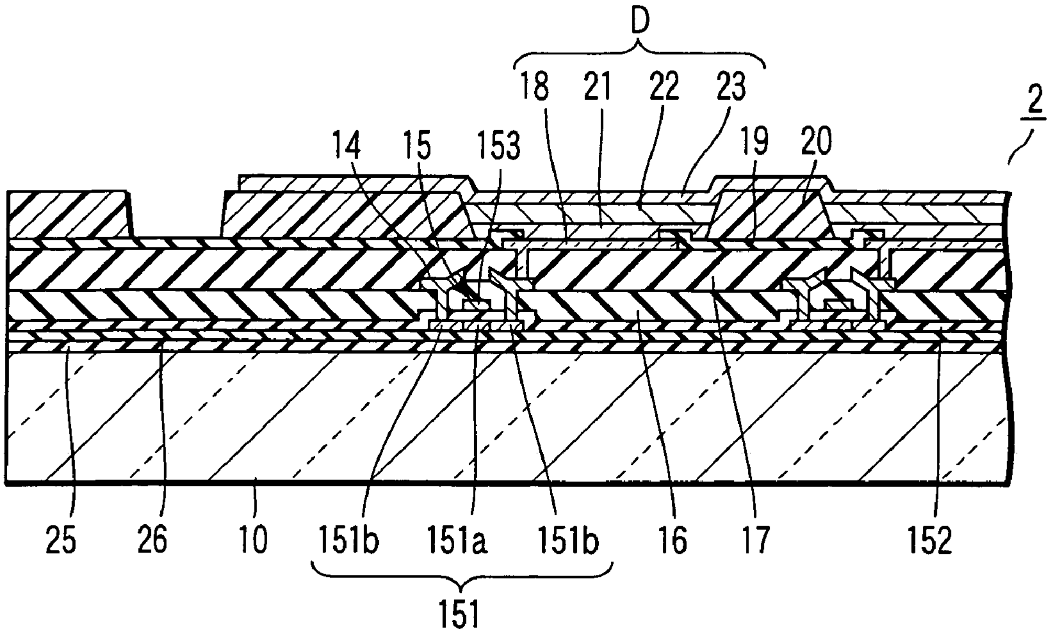
Figure 11:
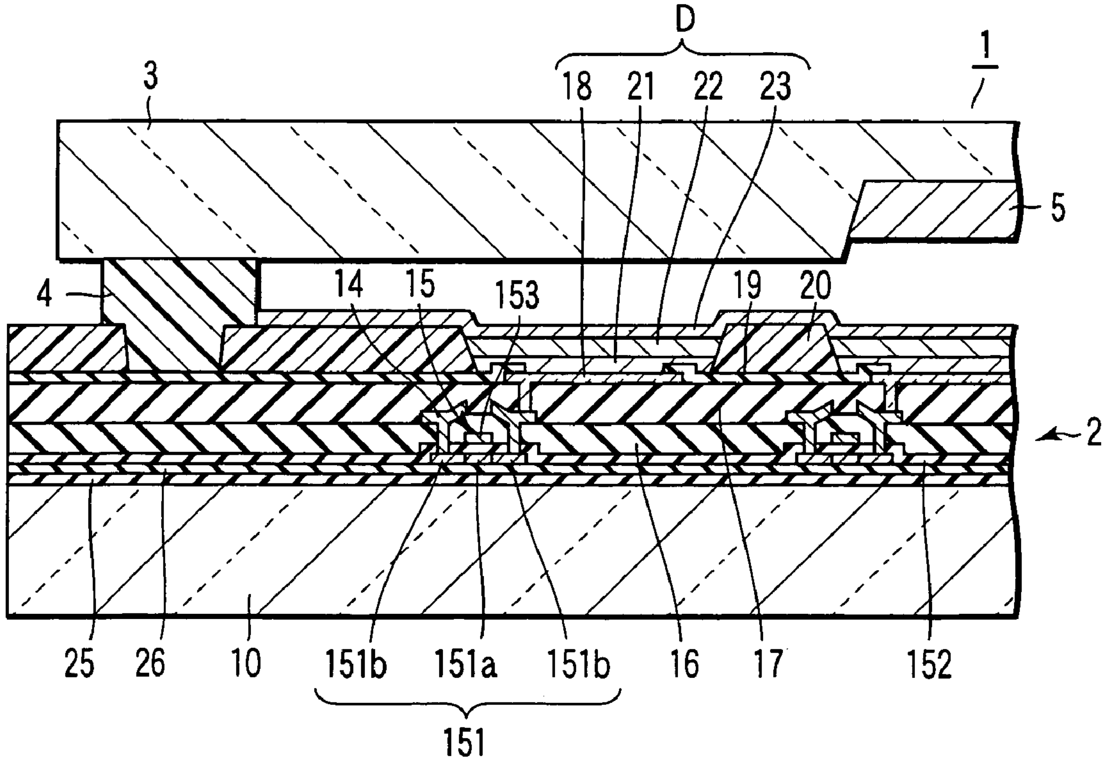

As shown in FIG. 10, the video signal line 14 and a passivation film 17 were sequentially formed, and a through hole was formed in the passivation film 17. Thereafter, a transparent electrode 18 made of ITO (Indium Tin Oxide) was formed as an anode. A hydrophilic layer 19 having an opening portion at a position corresponding to the central portion of the transparent electrode 18 was formed on the passivation film 17. A partition insulating layer 20 was formed on the hydrophilic layer 19. Thereafter, a buffer layer 21 containing PEDOT (polyethylenedioxythiophene) and a luminous layer 22 containing a luminescent organic compound were sequentially formed. In addition, a cathode 23 was formed on the luminous layer 22. With the above process, an array substrate 2 was completed.

Subsequently, an ultraviolet curing resin was applied to the peripheral portion of one major surface of a glass substrate 3 serving as a sealing substrate to form a seal layer 4. A sheet-like desiccant 5 was bonded to a recess portion formed in that surface of the sealing substrate 3 which faces the array substrate 2. The sealing substrate 3 and array substrate 2 were then bonded to each other in an inert gas such as dry nitrogen gas such that the surface of the sealing substrate 3 on which the seal layer 4 was provided faced the surface of the array substrate 2 on which the cathode 23 was provided. The seal layer was then cured by ultraviolet light to complete the organic EL display 1 shown in FIG. 11. In this case, the array substrate 2 was sealed by using the sealing substrate 3. However, the array substrate 2 may be sealed by bonding a resin film to it.

The organic EL display 1 obtained by the above method was connected to an external drive circuit and power supply. The resultant structure was supported by a bezel, and a circularly polarizing plate was provided as an antireflection film on the outer surface of the array substrate 2. When the display characteristics of the device in this state were checked, no display irregularity was visually recognized.

In this case, the organic EL display 1 is of a bottom emission type designed to extract display light from the array substrate 2 side. However, this display may be of a top emission type designed to extract display light from the sealing substrate 3 side. In this case as well, display irregularity can be prevented from being visually recognized.

COMPARATIVE EXAMPLE

An organic EL display 1 was manufactured by the same method as that described in the above example except that the positions of transistor formation portions SINa to SINc in the x direction were made to coincide with each other. In the comparative example, the arrangement shown in FIG. 3 was adopted for the transistor formation portions SI.

When the display characteristics of the organic EL display 1 were checked, luminance irregularity was visually recognized in the form of stripes extending in the y direction.

Additional advantages and modifications will readily occur to those skilled in the art. Therefore, the invention in its broader embodiments is not limited to the specific details and representative embodiment shown and described herein. Accordingly, various modifications may be made without departing from the spirit or scope of the general inventive concept as defined by the appended claims and their equivalents.

What is claimed is:

1. An active matrix display comprising pixels arrayed in a matrix and each including a display element and a polysilicon thin film transistor, wherein the pixels in each column of the matrix are arranged in a line and are divided into at least a first pixel group in which the polysilicon thin film transistors are arranged along a first straight line parallel with the column, and a second pixel group in which the polysilicon thin film transistors are arranged along a second straight line parallel with the column and offset from the first straight line, and wherein the polysilicon thin film transistor is a drive transistor, the drive transistor and the display element being connected in series between first and second power supply terminals.

2. The display according to claim 1, wherein each of the pixels further includes a pixel switch which is connected between a video signal line and a gate of the drive transistor and whose switching operation is controlled by a scan signal supplied from a scan signal line, and a capacitor which is connected to the gate of the drive transistor.

3. The display according to claim 1, wherein dispersion of mobilities of the thin film transistors is narrower in the first and second pixel groups than that in the column.

4. The display according to claim 1, wherein the pixels in the first pixel group and the pixels in the second pixel group are alternately arranged in a direction parallel with the column.

5. The display according to claim 1, wherein in each of the columns, the pixels in the same column are equal to each other in a position of the display element in a direction parallel with rows which the pixels form.

6. The display according to claim 5, wherein in each of the columns, the pixels adjacent in a direction parallel with the column are different from each other in a relative position of the display element with respect to the polysilicon thin film transistor in the direction parallel with the rows.

7. The display according to claim 1, wherein in each of the columns, the pixels adjacent in a direction parallel with the column are different from each other in a relative position of the display element with respect to the polysilicon thin film transistor in a direction parallel with rows which the pixels form.

* * * * *